United States Patent
Ting (10) Patent No.: US 7,316,960 B2
(45) Date of Patent: Jan. 8, 2008

(54) STRAIN ENHANCED ULTRA SHALLOW JUNCTION FORMATION

(75) Inventor: Steve Ming Ting, Bridgewater, NJ (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 10/889,915

(22) Filed: Jul. 13, 2004

(65) Prior Publication Data

US 2006/0017138 A1     Jan. 26, 2006

(51) Int. Cl.
*H01L 21/336*  (2006.01)
*H01L 21/469*  (2006.01)

(52) U.S. Cl. .................. 438/301; 438/308; 438/778; 257/E21.409

(58) Field of Classification Search ............... 438/778, 438/308; 257/E29.242, E21.409
See application file for complete search history.

(56) References Cited

U.S. PATENT DOCUMENTS

| | | | | |
|---|---|---|---|---|
| 4,549,064 A | * | 10/1985 | Delfino | 219/121.85 |
| 5,420,056 A | * | 5/1995 | Moslehi | 438/308 |
| 5,633,202 A | * | 5/1997 | Brigham et al. | 438/763 |
| 5,861,328 A | * | 1/1999 | Tehrani et al. | 438/210 |
| 2005/0035470 A1 | * | 2/2005 | Ko et al. | 257/900 |

OTHER PUBLICATIONS

Heemyong Park et al., 'The Effects of Strain on Dopant Diffusion in Silicon', 1993, pp. 303-306, 0-7803-1450-6.
Samir Chaudhry et al., 'The Stress Assisted Evolution of Point and Extended Defects in Silicon', Aug. 1, 1997, pp. 1138-1146, American Institute of Physics, 0021-8979/97/82(3)/1138/9.
Babak Sadigh et al, 'Large Enhancement of Boron Solubility in Silicon Due to Biaxial Stress', Jun. 24, 2002, pp. 4738-4740, vol. 80, No. 25, American Institute of Physics, 0003-6951/2002/80(25)4738/3.

* cited by examiner

*Primary Examiner*—Lex Malsawma
(74) *Attorney, Agent, or Firm*—Haynes Boone, LLP (57) ABSTRACT

Provided is a method of manufacturing a microelectronic device. In one example where the device includes a semiconductor substrate with a gate feature and a shallow junction, the method includes introducing dopants to the substrate to form a source region and a drain region. A strained layer may be formed over the substrate after introducing the dopants, and an annealing process may be performed after forming the strained layer.

30 Claims, 8 Drawing Sheets

STRAIN ENHANCED ULTRA SHALLOW JUNCTION FORMATION

BACKGROUND

An integrated circuit (IC) is formed by creating one or more devices (e.g., circuit components) on a semiconductor substrate using a fabrication process. As fabrication processes and materials improve, semiconductor device geometries have continued to decrease in size. For example, current fabrication processes are producing devices having geometry sizes (e.g., the smallest component or line that may be created using the process) of 90 nm or less. However, the reduction in size of device geometries frequently introduces new challenges that need to be overcome.

The scaling-down in IC technologies has resulted in microelectronic devices, such as metal-oxide-semiconductor field effect transistors (MOSFETs), that have ultra shallow junctions. This junction thickness is required to decrease undesired short channel effects. However, reducing the junction thickness may lead to high sheet resistance and low drive current.

Accordingly, what is needed in the art is an integrated circuit device and method for manufacturing thereof that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to microelectronic devices and methods of manufacturing thereof and, more specifically, to manufacturing a microelectronic device with a shallow junction.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Figure 1:
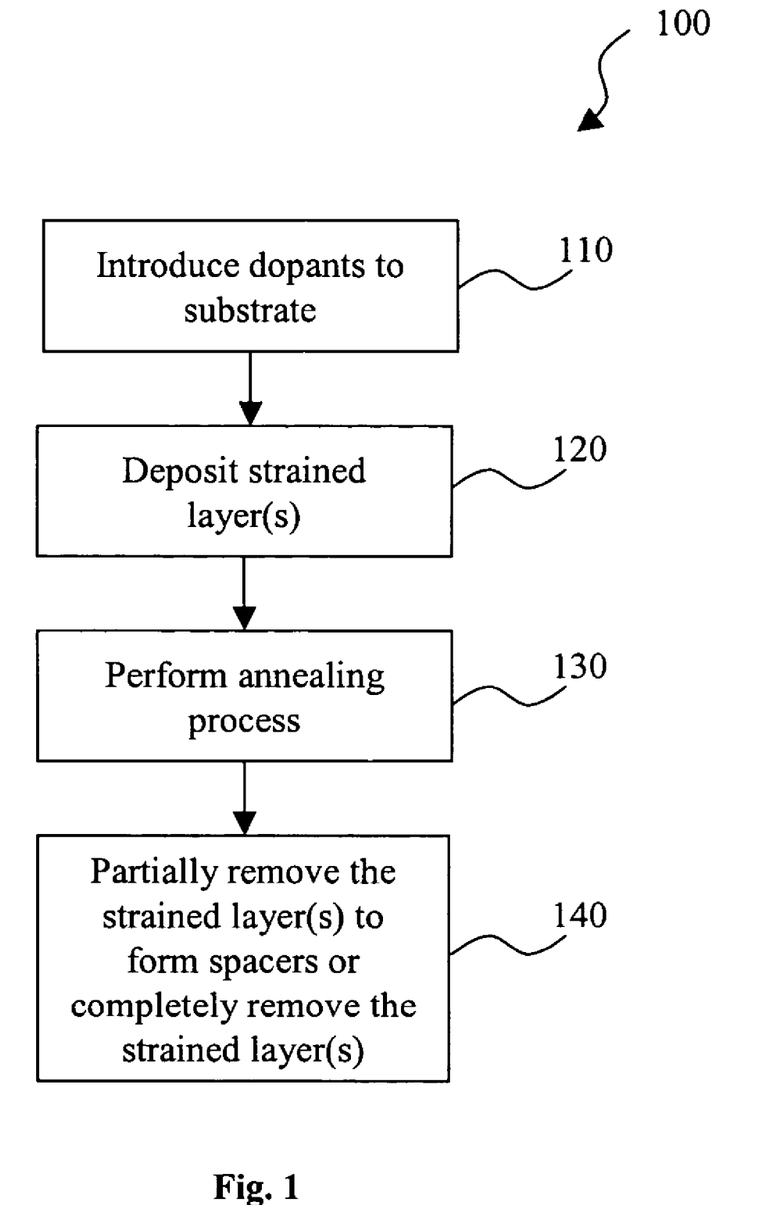
FIG. 1 is a flow chart of one embodiment of a exemplary method for fabricating a microelectronic device according to aspects of the present disclosure.

Referring to FIG. 1 and with additional reference to FIGS. 2-7, in one embodiment, a method 100 may be used to fabricate a microelectronic device with a strain enhanced ultra shallow junction. Generally, two parameters (junction thickness and sheet resistance) form a trade-off that may be balanced to achieve a designated function. To reduce both the sheet resistance and junction thickness, the doping concentration may be enhanced to provide higher carrier concentration. The method 100 may be used to address fabrication issues raised by the solid solubility of dopants.

FIGS. 2-7 provide sectional views of one embodiment of a microelectronic device 200 (in intermediate stages of manufacturing) that may be fabricated using the method 100. The device 200 includes a substrate 210 that may have a plurality of isolation features that define active regions (not shown). A gate 220 may be formed over the substrate 210. The substrate 210 may include a plurality of such gate structures and/or other structures and features.

Figure 2:
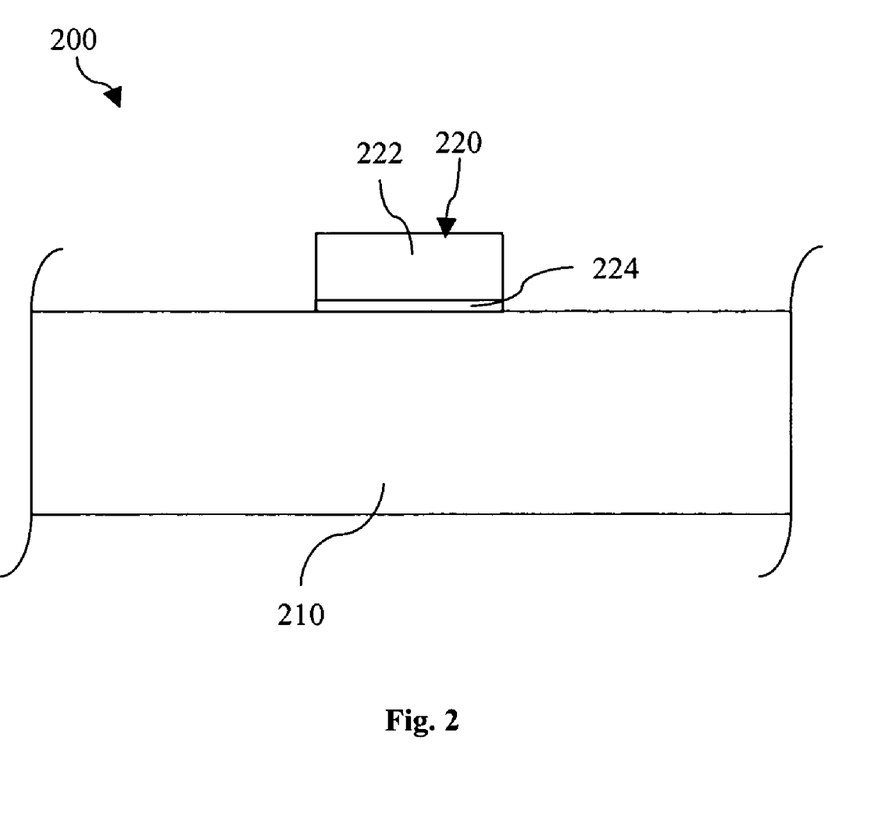
FIGS. 2-7 illustrate sectional views of one embodiment of a microelectronic device during intermediate stages of manufacturing that may be fabricated by the method of FIG. 1.

The semiconductor substrate 210 may use an elementary semiconductor such as crystal silicon, polycrystalline silicon, amorphous silicon, germanium, and diamond, a compound semiconductor such as silicon carbide and gallium arsenic, or an alloy semiconductor such as SiGe, GaAsP, AlInAs, AlGaAs, GaInP, or any combination thereof. Furthermore, the semiconductor substrate may be a bulk semiconductor such as bulk silicon, and the bulk silicon may include an epitaxy silicon layer.

There might be an insulator layer between the substrate 210 and overlying well structures such as dual-well and triple-well structures. In one embodiment, the insulator layer may be a buried oxide (BOX) layer, such as that formed by a method referred to as separation by implantation of oxygen (SIMOX) technology, or wafer bonding. The insulator layer may also be formed over the substrate 110 by thermal oxidation, atomic layer deposition (ALD), chemical vapor deposition (CVD), physical vapor deposition (PVD) and/or other processes. Chemical mechanical polishing (CMP) and/or other methods may be employed to attain a desired thickness of the insulator layer. Moreover, although not limited by the scope of the present disclosure, the insulator layer may include oxide, silicon oxide, silicon nitride, silicon oxynitride, low k materials, air gap, combinations thereof, and/or other materials.

The isolation layer may utilize isolation technology such as local oxidation of silicon (LOCOS) and/or shallow trench isolation (STI). LOCOS may include thermal oxidation using a patterned mask layer. STI may include dry etching a trench in a substrate and filling the trench by insulator materials such as silicon oxide, silicon nitride, silicon oxynitride, low k materials, air gap, or combinations thereof. The trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

The gate 220 may further include a gate electrode 222 and a gate dielectric 224. The gate dielectric 224 may include silicon oxide, silicon oxynitride, or a high k dielectric, such as hafnium oxide, hafnium silicide, hafnium silicon oxide, hafnium silicon oxynitride, zirconium oxide, aluminum oxide, a hafnium dioxide-alumina ($HfO_2$-$Al_2O_3$) alloy, silicon nitride, tantalum pentoxide, and/or combinations thereof. The gate dielectric 224 may be formed by thermal oxide, ALD, CVD, or PVD. The gate dielectric 224 may have a multi-layer structure (not shown), such as a first layer of silicon oxide formed by thermal oxidation, and a second layer of high k material. Additional processing may be performed during formation of the gate dielectric 224, such as nitrogen treatment of a thermal oxide layer and/or annealing of the gate dielectric stack, including both the silicon oxide layer and the high k layer.

The gate electrode 222 may be connected to an overlying interconnect structure through one or more low resistant interfaces. The gate electrode 222 may include conductive materials and may have a multilayer structure. The gate electrode 222 may contain silicon, germanium, other conductive materials, and/or combinations thereof. For example, the conductive material may include doped polycrystalline silicon (poly-Si), poly-SiGe, metal, metal silicide, metal nitride, metal oxide, carbon nanotubes, or a combination thereof. The metal may include copper, tungsten, aluminum, aluminum alloy, palladium, titanium, tantalum, nickel, cobalt, and molybdenum. The metal silicide may include copper silicide, tungsten silicide, aluminum silicide, palladium silicide, titanium silicide, tantalum silicide, nickel silicide, cobalt silicide, erbium silicide, and molybdenum silicide. The gate electrode 222 may be formed by CVD, PVD, silicidation, plating, and/or ALD. Additional processing may be performed during formation of the gate electrode 222, such as implant doping for polysilicon or annealing for silicidation. The gate electrode may have a dual structure, such as different gate heights for a PMOS and an NMOS, and/or may use different materials for the NMOS and PMOS.

Figure 3:
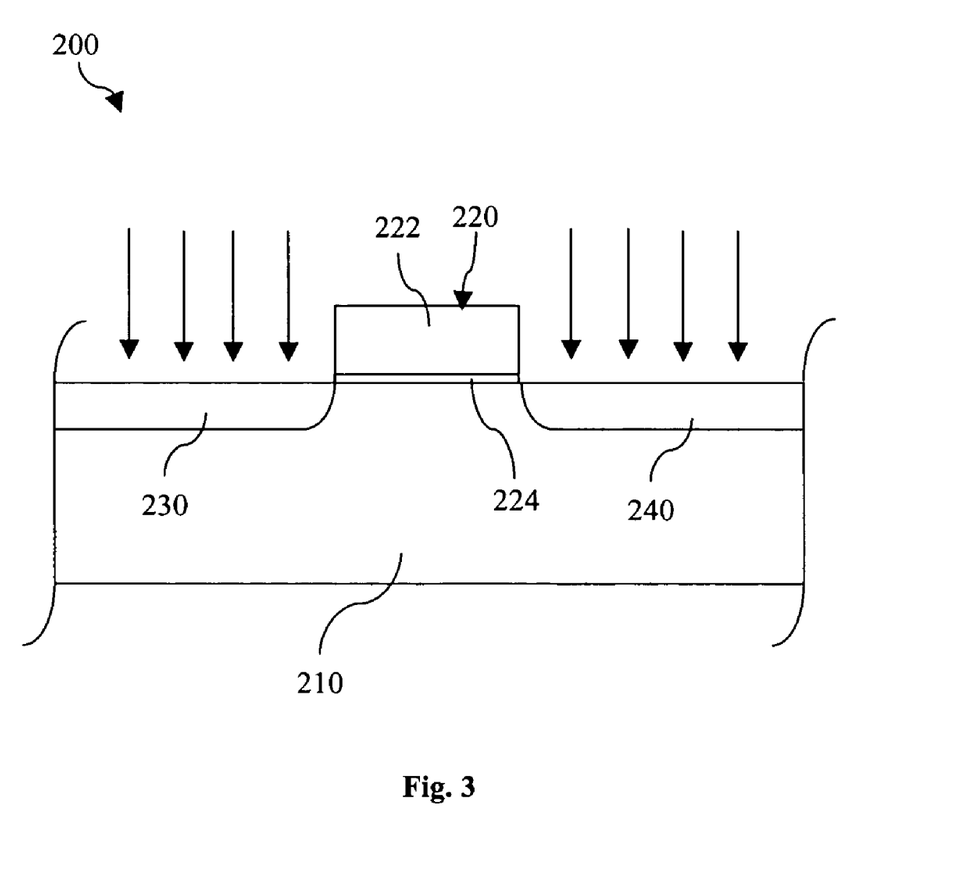

In step 110 (FIG. 1) and with additional reference to FIG. 3, dopants may be introduced to the substrate 210. The dopants may be introduced via a process such as ion implantation. The ion implantation may form doped regions 230 and 240 as a source and a drain, respectively. In one embodiment, the doped regions 230 and 240 are lightly doped drain (LDD) regions of a source and a drain, respectively.

In the present example, the thickness of the doped regions (e.g., the source 230 and the drain 240) may be very thin. For example, the thickness of the doped regions may be less than 500 Å. The impurity concentration may be $1 \times 10^{20}$ atoms/$cm^3$ or higher, and the doping dose may range between about $5 \times 10^{14}$ atoms/$cm^2$ to about $5 \times 10^{15}$ atoms/$cm^2$.

In one embodiment, the ion implantation may be performed by plasma source ion implantation (PSII), which may be referred to as plasma source ion immersion. PSII may include a process wherein an electrode layer may be exposed to a plasma source, while an applied bias may be applied to the substrate. The processing tool to perform PSII may include a single and/or batch wafer reactor, wherein a direct current (DC) and/or radio frequency (RF) bias may be applied to the substrate. The PSII reactor includes a process ambient pressure that may range between 0.01 mTorr and about 1000 Torr. The substrate may be held at a temperature ranging between 150° C. and about 1100° C. High density plasma may be produced by a microwave electron cyclotron resonance (ECR) plasma, a helicon plasma, an inductively coupled plasma, and/or other high density plasma sources. The plasma may comprise Ar, H, N, Xe, O, As, $B_2H_6$, $GeH_4$, P, and/or other sources of the impurity. For example, the helicon plasma may utilize RF powers ranging between about 200 Watts and about 2500 Watts. The applied bias may range between about ±200 V and about ±5000 V.

Figure 4:
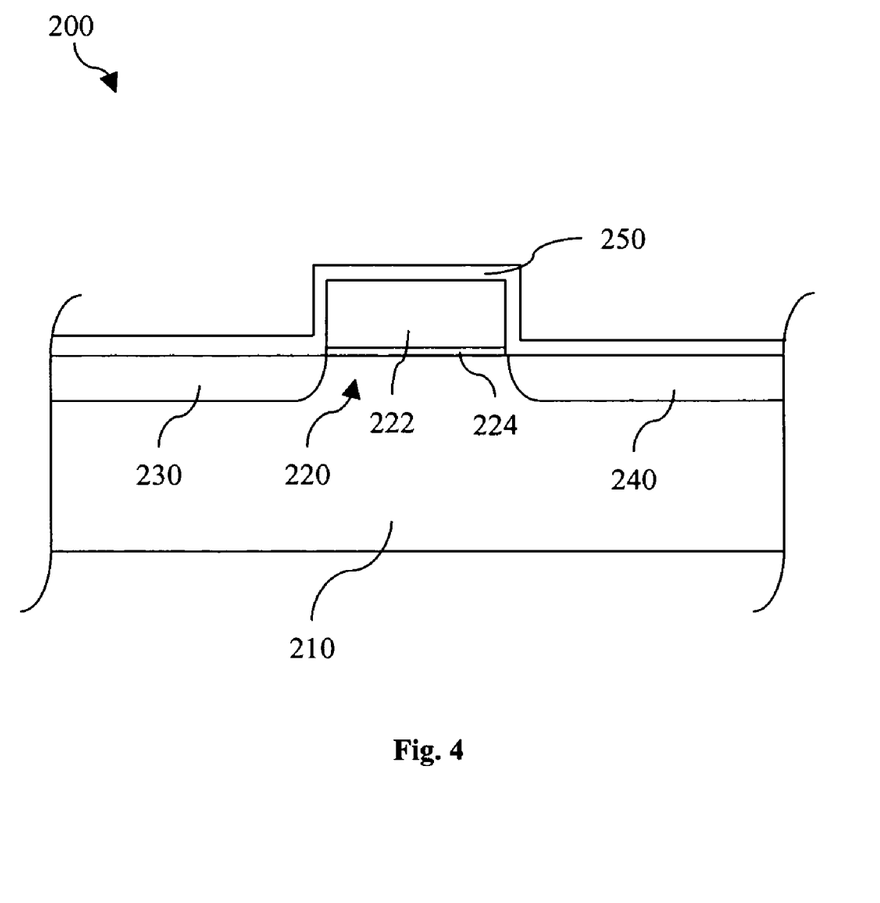

In step 120 and with additional reference to FIG. 4, one or more strained layers 250 may be formed over the substrate after the dopants have been introduced to the substrate. The strained layer 250 may include a nitrogen containing film such as silicon nitride, silicon oxynitride, and/or doped silicon. The strained layer 250 may further include silicon oxide and silicon carbide. In some examples, the strained layer 250 may have a multilayer structure, such as a thin silicon oxide film and a thick silicon nitride film. Exemplary methods to form the strained layer may include, but are not limited to, CVD, PVD, ALD, and thermal oxidation (for silicon oxidation). The thickness of the strained layer 250 may range from about 5 nm to about 200 nm. The stress of the strained layer 250 may range between about −2 GPa and about +2 GPa.

It is understood that parameters and factors associated with the formation of the strained layer 250, including deposition methods, deposition temperature, materials, structure, and thickness, may be used to tune the stress of the strained layer to enhance the solid solubility of the dopants in the substrate (e.g., boron solubility in a silicon substrate). In another embodiment, ion implantation 110 may be implemented after forming the strained layers 250.

In step 130, an annealing process may be performed on the microelectronic device 200 after the formation of the strained layer. The annealing process may be carried out for activation and healing damage induced during the ion implantation. The annealing process may include a rapid thermal process (RTP), solid phase epitaxy (SPE) recrystallization, laser annealing, and/or spike annealing. The annealing temperature may depend on the annealing process. For example, spike annealing may have a temperature ranging between about 1000° C. and about 1100° C., while SPE recrystallization may have process temperature about 500° C. or below.

When a microelectronic device is scaled down to shallow junction or even ultra shallow junction ranges, a high dopant concentration may be needed to avoid the degradation of the sheet resistance of the junction. Transient enhanced diffusion (TED) places an upper limit of the junction depth to avoid the short channel effect. The present disclosure may use the strained layer to enhance the solid solubility of the substrate, reduce diffusion during the post annealing process, and improve the sheet resistance of the shallow junction. For example, boron ion implantation may generate silicon interstitials and vacancies that enhance dopant diffusivity. Silicon interstitials may be repelled by regions of compressive strain, whereas vacancies may be repelled by regions of tensile strain. Since boron TED is assisted by silicon interstitials, applying a compressive strain to source/drain extension may reduce diffusion and enable reduction of the junction thickness.

Figure 5:
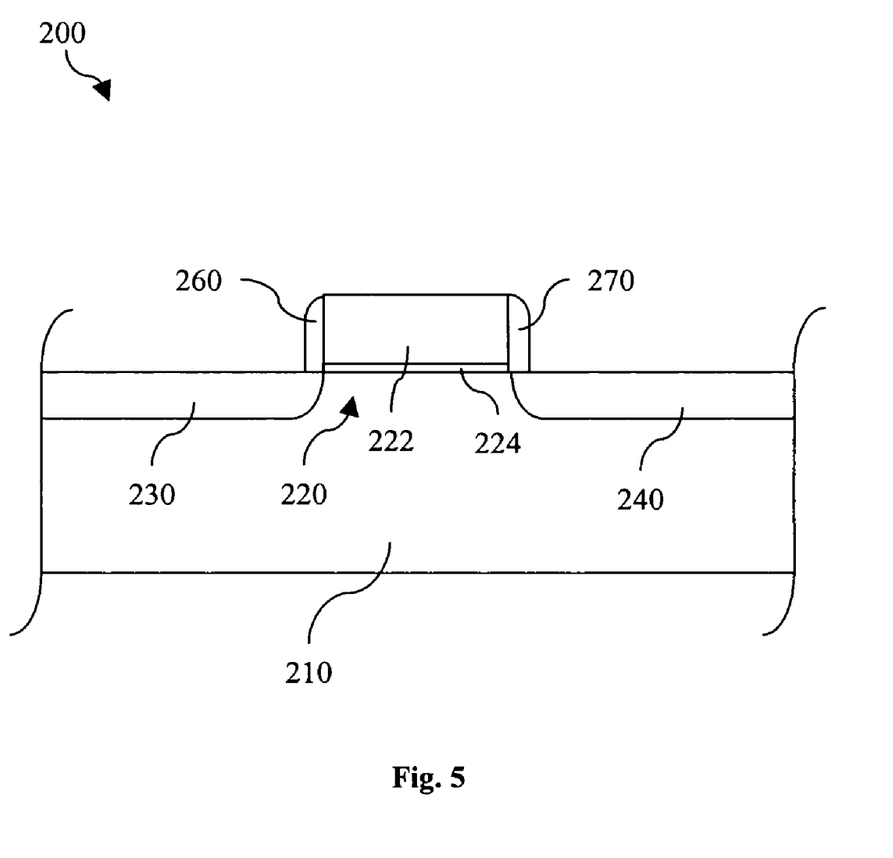
Figure 6:
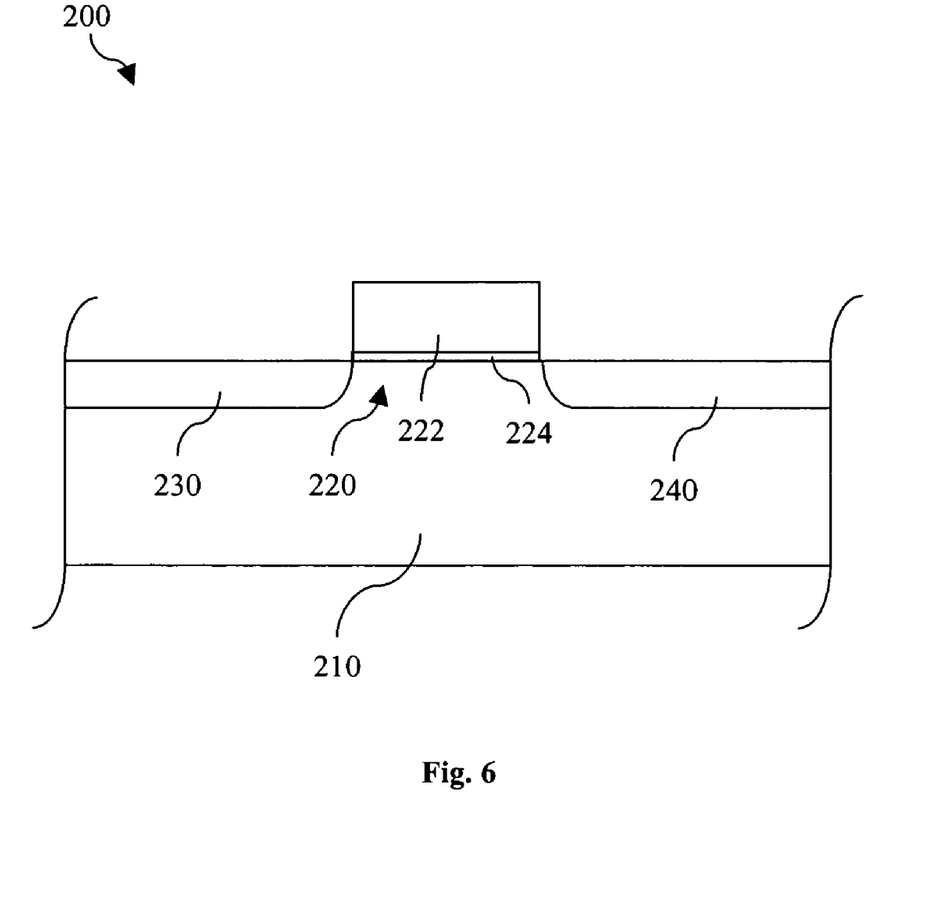

In step 140 and with additional reference to FIGS. 5 and 6, the strained layer 250 may be partially removed (FIG. 5) or completely removed (FIG. 6). In one embodiment (FIG. 5), the strained layer 250 may be partially removed by a process such as dry etching to form spacers 260 and 270 disposed on both sides of the gate 220. Processes to partially remove the strained layer 250 may include a dry etching process and/or other processes known in the art. In another embodiment (FIG. 6), the strained layer 150 may be completely removed by a conventional process such as wet etching. It is understood that a plurality of processes may follow or precede the method 100, including spacer formation and ion implantation to form deep source and drain regions.

The present disclosure is not limited to applications in which the microelectronic device 200 has a gate structure or a MOS transistor, and may be extended to any integrated circuit containing a highly doped region. For example, in other embodiments, the microelectronic device 200 may include an electrically programmable read only memory (EPROM) cell, an electrically erasable programmable read only memory (EEPROM) cell, a static random access memory (SRAM) cell, a dynamic random access memory (DRAM) cell, a single electron transistor (SET), and/or other microelectronic devices (collectively referred to herein as microelectronic devices). The geometric features of the microelectronic device 200 may range between about 1300 Angstroms and about 5 Angstroms. The microelectronic devices may comprise FinFET transistors. Of course, aspects of the present disclosure are also applicable and/or readily adaptable to any type of transistor, including single-gate transistors, double-gate transistors, triple-gate transistors, and other multiple-gate transistors, and may be employed in many different applications, including sensor cells, memory cells, logic cells, and others.

Figure 7:
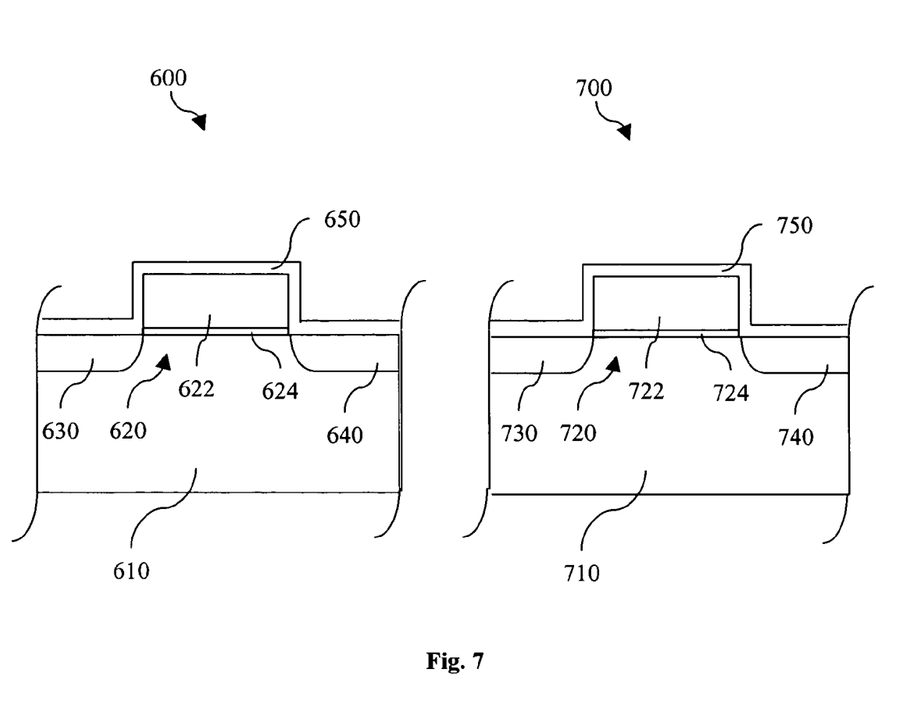

Referring now to FIG. 7, illustrated is a sectional view of another embodiment of a microelectronic device fabricated according to aspects of the present disclosure. The microelectronic device includes a first-type device 600 and a second-type device 700 formed in a semiconductor wafer, wherein the second type is different from the first type. For example, the first-type device 600 may be an n-type MOS (NMOS) transistor and the second-type device 700 may be a p-type MOS (PMOS) transistor.

The NMOS transistor 600 may comprise a p-type doped substrate 610. A gate 620 may be formed over the substrate 610, wherein the gate 620 may further include a gate electrode 622 and a gate dielectric 624. A source 630 and a drain 640 may be formed by introducing n-type dopants such as phosphorus or arsenic using a process such as ion implantation. A strained layer 650 may be formed over the substrate having the source 630 and the drain 640. Parameters and factors associated with the formation of the strained layer 650 may include a deposition method, a deposition temperature, a film material, a film structure, a film thickness, and other parameters. It is understood that these may be used to tune the stress of the strained layer 650 to enhance the equilibrium solubility limit of the n-type dopant in the substrate (e.g., phosphorus in a silicon substrate).

Similarly, the PMOS transistor 700 may comprise an n-type doped substrate 710. A gate 720 may be formed over the substrate 710, wherein the gate 720 may further include a gate electrode 722 and a gate dielectric 724. A source 730 and a drain 740 may be formed by introducing an n-type dopant such as boron using a process such as ion implantation. A strained layer 750 may be formed over the substrate having the source 730 and the drain 740. Parameters and factors associated with the formation of the strained layer 750 may include a deposition method, a deposition temperature, a film material, a film structure, a film thickness, and other parameters. It is understood that these may be used to tune the stress of the strained layer 750 to enhance the equilibrium solubility limit of the p-type dopant in the substrate (e.g., boron in a silicon substrate). The tuned stress of the strained layer 750 may be different from that of the strained layer 650. The materials and processes involved in manufacturing the NMOS transistor 600 and/or the PMOS 700 may be substantially similar to those of the microelectronic device 200 previously described.

Figure 8:
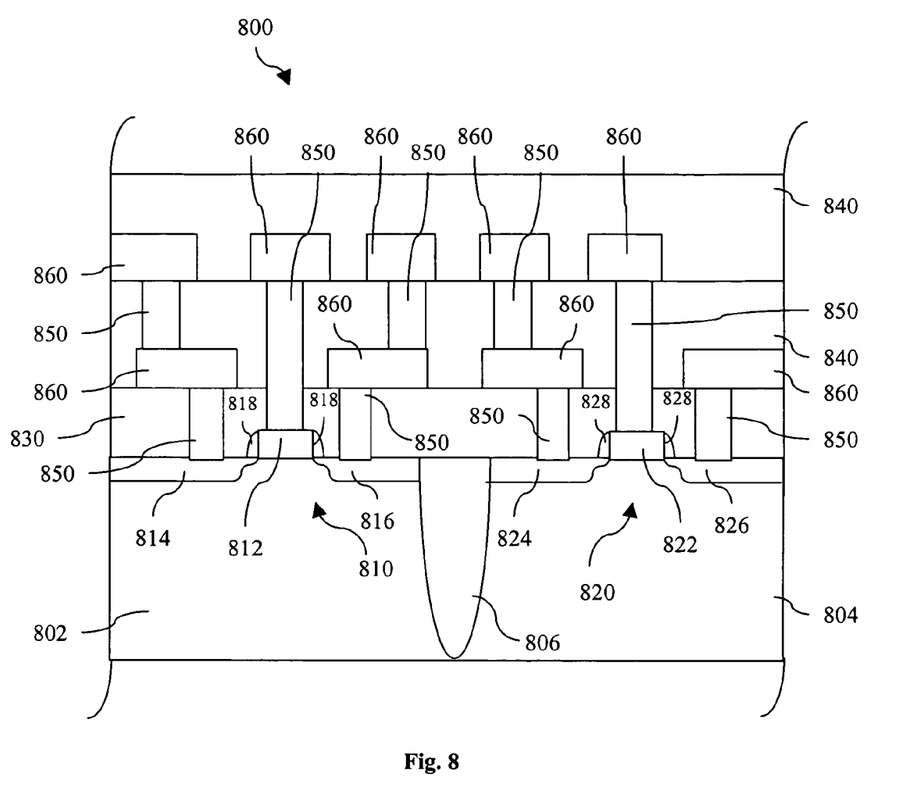
FIG. 8 illustrates a sectional view of one embodiment of an integrated circuit constructed according to aspects of the present disclosure.

Referring now to FIG. 8, illustrated is a perspective view of one embodiment of a microelectronic circuit 800 constructed according to aspects of the present disclosure. The integrated circuit 800 is one environment in which the microelectronic devices 200, 600, and/or 700 may be implemented. For example, the integrated circuit device 800 may include a plurality of microelectronic devices 200, 600, and 700, wherein one or more of the microelectronic devices 200, 600, and 700 may be substantially similar.

The integrated circuit 800 may include a semiconductor substrate such as a silicon substrate which further comprises a p-type doped region 802 and an n-type doped region 804 separated by an isolation feature 806. The isolation feature 806 may be a local oxidation of silicon (LOCOS) or a shallow trench isolation (STI) structures. An NMOS transistor 810 is formed in the p-type doped region 802 and a PMOS transistor 820 is formed in the n-type doped region 804. The NMOS transistor 810 may comprise a gate 812, a source 814 and drain 816 of n-type dopant. The source 814 and the drain 816 may have a thickness below 300 Angstroms. The n-type dopant may comprise phosphorus or boron, and the dopant may have a concentration higher than the equilibrium solubility limit (ESL) of an n-type dopant in a stress-free substrate because the strained substrate may have enhanced ESL during annealing processing. The NMOS transistor may further comprise a spacer feature 818. The spacer feature 818 may be a portion of the strained layer after partially removal of the strained layer. The PMOS transistor 820 may comprise a gate 822, a source 824, and drain 826 of p-type dopant. The source 824 and the drain 826 may have a thickness below 300 Angstroms. The p-type dopant may comprise boron and the dopant may have a concentration higher than ESL of the p-type dopant in a stress-free substrate since the strained substrate may enhance ESL during annealing processing. The PMOS transistor may further comprise a spacer feature 828. The spacer feature 828 may be a portion of the strained layer after partially removal of the strained layer, wherein the spacer feature 828 may comprise different materials from those of the spacer feature 818 and may have different stress type (compressive or tensile) and amplitude from those of the spacer feature 818. The spacer features 818 and 828 may have stress residuals of the original strained layers, respectively. The spacer features may comprise silicon nitride, silicon oxynitride, silicon oxide, silicon carbide, or combinations thereof. The spacer features may have a multilayer structure.

The integrated circuit device 800 further includes one or more insulating layers 830, 840 located over the microelectronic devices 810 and 820. The first insulating layer 830, which may itself comprise multiple insulating layers, may be planarized to provide a substantially planar surface over the plurality of microelectronic devices 810 and 820. In one embodiment, the device 810 comprises an NMOS transistor and the device 820 comprises a PMOS transistor.

The integrated circuit device 800 also includes vertical interconnects 850, such as conventional vias or contacts, and horizontal interconnects 860. All spatial references herein are for the purpose of example only and are not meant to limit the disclosure. The interconnects 850 may extend through one or more of the insulating layers 830, 840, and the interconnects 860 may extend along one of the insulating layers 830 and 840. In one embodiment, one or more of the interconnects 850 and 860 may have a dual-damascene structure. The interconnects 850 and 860 may be formed by etching or otherwise patterning the insulating layers 830 and 840 and subsequently filling the pattern with conductive material, such as tantalum, tantalum nitride, titanium, titanium nitride, tungsten, copper, and aluminum.

The present disclosure may not be limited to MOS transistors. The disclosed method may be extended to fabricate doped regions in a semiconductor substrate for other applications. The doped region may comprise a source, a drain, a doped polysilicon gate electrode, a doped silicon resistor, a MOS transistor, a complementary MOS (CMOS) transistor, a bipolar transistor, a high power transistor, or/and other doped regions wherein the solubility of the dopant may be enhanced for a high doping concentration.

One or more high temperature annealing processes may be implemented after the formation of the strained layer for activation and recovery of the crystal structure of the substrate after damage induced by the ion implantation. The high temperature annealing processes may include RTA, SPE recrystallization, spike annealing, and/or laser annealing. Since the equilibrium solubility limit of the dopant may be enhanced by the strained layer, the dopant concentration after the annealing process may be higher than that of the ESL in a substrate not having a strained layer.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method for manufacturing a microelectronic device having a semiconductor substrate with a shallow junction, the method comprising:
   introducing dopants to the substrate to form a source region and a drain region;
   forming a strained layer in contact with at least a portion of the source and drain regions;
   performing an annealing process after forming the strained layer and prior to performing further processing steps on the device; and
   completely removing the strained layer after the annealing process.

2. The method of claim 1 wherein the microelectronic device comprises a metal-oxide-semiconductor field effect transistor (MOSFET).

3. The method of claim 2 wherein the shallow junction has a thickness ranging from about 100 .ANG. to about 500 .ANG.

4. The method of claim 1 wherein introducing dopants includes performing an ion implantation process.

5. The method of claim 1 wherein the dopants comprise boron.

6. The method of claim 1 wherein the dopants comprise phosphorous.

7. The method of claim 1 wherein the dopants comprise arsenic.

8. The method of claim 1 wherein the dopants introduced to the substrate have a dopant concentration about $1 \times 10^{20}$ atoms/cm$^3$ or higher.

9. The method of claim 1 wherein introducing dopants to form the source and drain regions includes forming a lightly doped drain (LDD) region of the source and drain regions.

10. The method of claim 1 wherein forming a strained layer over the substrate includes performing a chemical vapor deposition (CVD) process.

11. The method of claim 1 wherein forming a strained layer over the substrate includes performing a physical vapor deposition (PVD) process.

12. The method of claim 1 wherein the strained layer comprises silicon nitride.

13. The method of claim 1 wherein the strained layer comprises silicon oxynitride.

14. The method of claim 1 wherein the strained layer conforms to the substrate.

15. The method of claim 1 wherein the strained layer has a stress ranging from about −2 GPa to about +2 GPa.

16. The method of claim 1 wherein the annealing process uses a temperature ranging from about 500° C. to about 1100° C.

17. The method of claim 1 wherein performing the annealing process includes using rapid thermal annealing (RTA).

18. The method of claim 1 wherein performing the annealing process includes using solid phase epitaxial (SPE) recrystalline annealing.

19. The method of claim 1 wherein performing the annealing process includes using spike annealing.

20. The method of claim 1 wherein performing the annealing process includes using laser annealing.

21. The method of claim 1 wherein completely removing the strained layer includes dry etching.

22. The method of claim 1 wherein completely removing the strained layer includes wet etching.

23. The method of claim 1 wherein the substrate includes a gate formed thereon, and wherein the gate comprises a gate electrode and a gate dielectric.

24. The method of claim 1 wherein the semiconductor substrate comprises materials selected from the group consisting of silicon, germanium, diamond, silicon carbide, gallium arsenic, gallium phosphide, indium phosphide, indium arsenide, indium antimonide, SiGe, GaAsP, AlInAs, AlGaAs, GaInAs, GaInP, and GaInAsP.

25. A method of manufacturing a microelectronic device, comprising:
    providing a semiconductor substrate;
    performing an implantation process to form a doped region in the semiconductor substrate;
    forming a strained layer adjacent to the doped region in the semiconductor substrate; and
    performing an annealing process; and
    completely removing the strained layer after performing the annealing process.

26. The method of claim 25 wherein introducing the dopants uses ion implantation.

27. The method of claim 25 wherein the dopants introduced into the semiconductor substrate have a dopant concentration of about $1 \times 10^{20}$ atoms/cm$^3$ or higher.

28. The method of claim 25 wherein the strained layer comprises silicon nitride.

29. The method of claim 25 wherein the strained layer comprises silicon oxynitride.

30. The method of claim 25 wherein the strained layer has a stress ranging from about −2 GPa to about +2 GPa.

* * * * *